(12) United States Patent
Fehrenbach et al.

(10) Patent No.: US 6,272,926 B1
(45) Date of Patent: *Aug. 14, 2001

(54) MICROMECHANICAL COMPONENT

(75) Inventors: Michael Fehrenbach; Dietrich Schubert, both of Reutlingen; Heinz-Georg Vossenberg, Pfullingen, all of (DE)

(73) Assignee: Robert Bosch GmbH, Stuttgart (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/293,233

(22) Filed: Apr. 16, 1999

(30) Foreign Application Priority Data

Apr. 18, 1998 (DE) ................................. 198 17 357

(51) Int. Cl.⁷ .................................................. G01P 15/125
(52) U.S. Cl. ..................................... 73/514.32; 73/514.38
(58) Field of Search .......................... 73/514.16, 514.17, 73/514.18, 514.24, 514.32, 514.38

(56) References Cited

U.S. PATENT DOCUMENTS

| 5,777,226 | * | 7/1998 | Ip ....................................... 73/514.38 |
| 5,817,942 | * | 10/1998 | Greiff ................................ 73/514.17 |
| 5,880,369 | * | 3/1999 | Samuels et al. ................... 73/514.16 |
| 6,065,341 | * | 5/2000 | Ishio et al. ......................... 73/514.38 |

* cited by examiner

Primary Examiner—John E. Chapman
(74) Attorney, Agent, or Firm—Kenyon & Kenyon

(57) ABSTRACT

A micromechanical component, in particular an acceleration sensor, includes a substrate, at least one spring element and at least one seismic mass. The spring element is joined at a first end to the substrate and at a second end to the mass, and the rigidity of the spring element is set such that a movement of the mass relative to the substrate can be caused by an acceleration parallel to a surface of the substrate. For the spring element, provision is made for a spring limit stop which limits a deformation of the spring element in response to an acceleration parallel to the surface of the substrate.

19 Claims, 2 Drawing Sheets

MICROMECHANICAL COMPONENT

FIELD OF THE INVENTION

The present invention relates to a micromechanical component.

BACKGROUND INFORMATION

Micromechanical components, in particular acceleration sensors, are known in which a seismic mass is suspended on a substrate by spring elements. As a result of an acceleration parallel to the surface of the substrate, a deflection of the mass can be caused which is measured using an appropriate measuring method. In this context, it is also known to limit the deflection of the mass by a limit stop.

SUMMARY OF THE INVENTION

In contrast, the micromechanical component according to the present invention has the advantage that impermissibly large deflections of the spring elements themselves are avoided. This is advantageous above all in sensors for acceleration, whose spring elements have only slight rigidity. As a result of the substrate limit stops, a planar contact of the mass and the substrate is avoided. Through multiply-folded spring elements, it is possible to realize very flexible spring elements, which can nevertheless be designed to be very resistant to breakage as a consequence of the corresponding bars.

It is particularly advantageous to use a conductive layer on the substrate, since in this way all the limit stops can be set at the same potential as the mass. The conductive layers can also be employed in forming substrate limit stops. As a material for the substrate, the spring elements, and the mass, silicon is particularly suitable.

DETAILED DESCRIPTION

Figure 1:
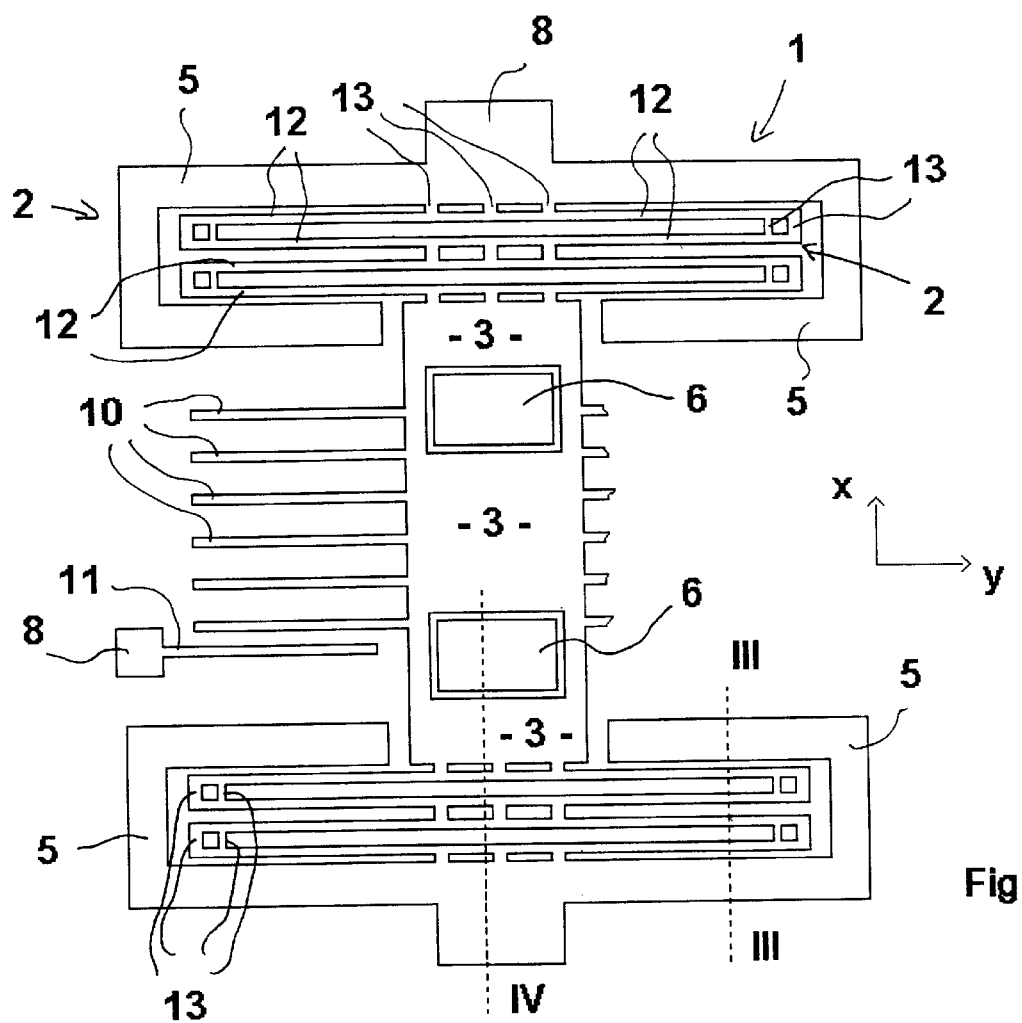
FIG. 1 shows a view of an acceleration sensor according to the present invention.
Figure 3:
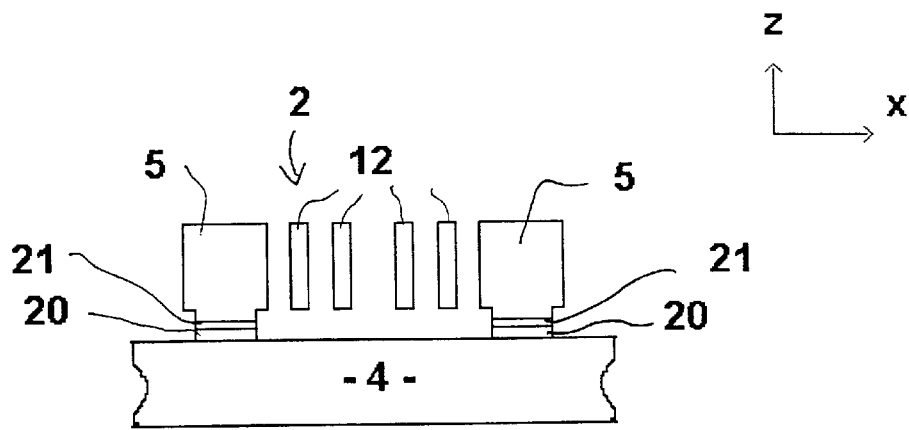
FIG. 3 shows a cross section of the acceleration sensor illustrated in FIG. 1.
Figure 4:
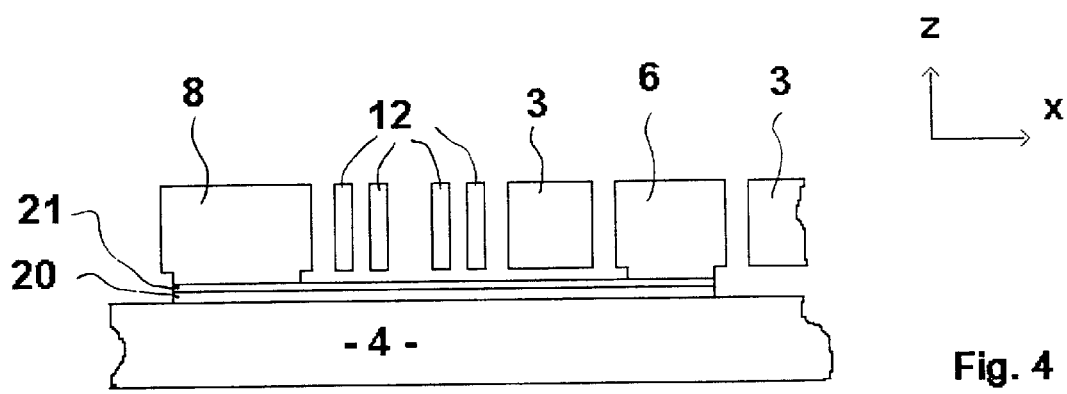
FIG. 4 illustrates another cross section of the acceleration sensor illustrated in FIG. 1.

In FIG. 1, a view of an acceleration sensor is depicted, and FIGS. 3 and 4 depict a cross-section of the acceleration sensor according to FIG. 1 along lines III and IV. Acceleration sensor 1, depicted in FIG. 1, is arranged on a substrate 4 which is not depicted in FIG. 1, the substrate 4 nevertheless being depicted in the cross sections of FIGS. 3 and 4. Acceleration sensor 1 has a spring-mass-system, which is composed of spring elements 2 and a seismic mass 3. As can be seen in FIG. 1, spring element 2 is constructed from a multiplicity of partial spring elements 12. Seismic mass 3 is connected via a plurality of connecting bars 13 to a first one of these partial spring elements 12. Partial spring elements 12 are connected by connecting bars 13, in each case, either at their external ends or at their center. Proceeding from seismic mass 3, a first partial spring element 12 is connected to seismic mass 3 with the assistance of three connecting bars 13 in the middle of partial spring element 12. This first partial spring element 12 is then connected with the assistance of connecting bars 13, which are situated in the outer area of the partial spring elements 12, to a second partial spring element 12, which then is connected by three connecting bars 13 in the middle to a third partial spring element 12. Third partial spring element 12 is then connected by external connecting bars 13 to a fourth partial spring element 12, which is connected by connecting bars 13 in the middle to a support 8. Support 8 is fixedly joined to substrate 4, which can be recognized in FIG. 4, for example.

FIG. 4 shows a cross-section of support 8, which is fixedly joined by layers 21 and 20 to substrate 4. The precise function of layers 21 and 20 will be discussed in greater detail below. Additionally, FIG. 4 depicts a cross-section of partial spring elements 12 and the parts of seismic mass 3. As can be clearly seen in FIG. 4, partial spring elements 12 and seismic mass 3 are joined to substrate 4 mechanically, not directly, but rather having a clearance from substrate 4. Partial spring elements 12 and seismic mass 3 are mechanically joined to substrate 4 exclusively via support 8. Partial spring elements 12 and seismic mass 3 therefore can be displaced relative to the substrate 4 by the operative acceleration forces. As a result of the corresponding adjustment of the rigidity of the spring elements 2, in this context, the sensitivity relative to the forces of acceleration is set.

As can be seen in the plan view of FIG. 1, the seismic mass 3 is secured to support 8 on two sides by spring elements 2. Spring elements 2, in this context, have partial spring elements 12, which are very long in the y direction and thus in the x direction have low stiffness. Thus it is assured that in response to small accelerations in the x direction a deflection of spring elements 2 and of seismic mass 3 will result. A multiplicity of movable electrodes 10 is mounted on seismic mass 3, the electrodes 10, for example, as is depicted in FIG. 1, being aligned perpendicularly in relation to the x direction. Parallel to these movable electrodes 10, provision is made for stationary electrodes 11, which in each case are fixedly joined to substrate 4 by a support 8. In FIG. 1, for reasons of simplification, only a single one of these stationary electrodes 11, having an associated support 8, is shown. In addition, in FIG. 1, only some few movable electrodes 10 are shown, which are completely represented only for the left side of seismic mass 3. This is also for reasons of simplification. Movable electrodes 10 and stationary electrodes 11 are insulated electrically from each other and thus form plate-type capacitors, whose capacitance changes as a function of the acceleration effective in the x direction. By measuring the capacitance, the acceleration can also be measured.

On the basis of the long extension of partial spring elements 12 in the y direction, spring elements 2 have a very slight rigidity in the x direction. Further, the rigidity in the z direction, i.e., perpendicularly to substrate 4, is also only slight. Since an acceleration sensor 1 that is designed, for example, for a measuring range down to simple gravitational acceleration, must also tolerate very large impact accelerations, provision is made for a multiplicity of limit stops. As can be seen in FIG. 1, provision is made inside seismic mass 3 for mass limit stops 6, which limit the deflection of seismic mass 3 parallel to the substrate 4 in the x direction and in the y direction. In addition, spring elements 2 are also surrounded by spring limit stops 5, which extend from supports 8 around partial spring elements 12 on all sides.

Figure 2:
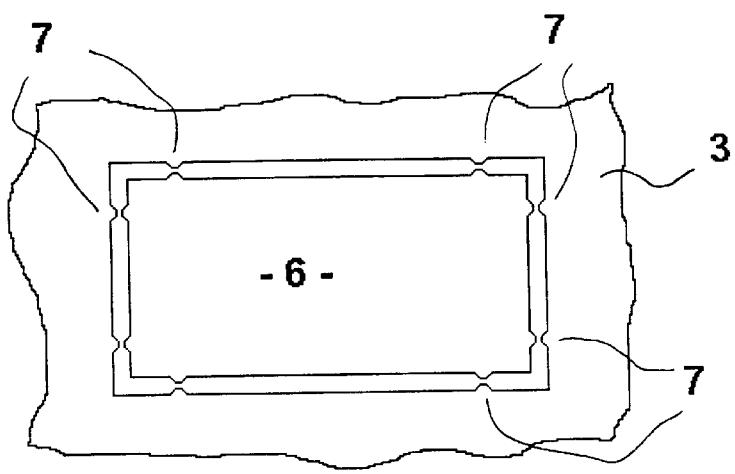
FIG. 2 shows a detail of the acceleration sensor illustrated in FIG. 1.

In FIG. 2, mass limit stops 6 of FIG. 1 are depicted in an enlargement. Mass limit stops 6 are structures that are fixedly joined to substrate 4, as this is depicted, for example, in FIG. 4 in cross section. As can be seen in FIG. 2, mass limit stops 6 are completely surrounded by seismic mass 3, so that the movements of seismic mass 3 are limited by limit stops 6 in every direction parallel to substrate 4, i.e., in the x and y directions. Both in seismic mass 3 as well as in mass limit stops 6, projections 7 are arranged that assure that only at individual points, namely at projections 7, is there contact between seismic mass 3 and limit stops 6. The distance between the projections 7, particularly in the x direction, is selected such that it is maximally ½ to ¾ of the distance between movable electrodes 10 and stationary electrodes 11. Thus it is reliably prevented that electrodes 10, 11, which are configured as elongated and mechanically less than stable structures, collide with each other and thus potentially become damaged. Further, the total surface of electrodes 10, 11 is relatively large, which in response to contact could potentially lead to adhesive forces arising that are so great that seismic mass 3 could no longer be pulled back to its original position by the spring forces of spring elements 2. Thus the operational reliability of the sensors is also increased by mass limit stops 6.

The function and the effect of spring limit stops 5 will now be explained in greater detail on the basis of FIG. 3. FIG. 3 shows a cross-section of the sensor according to FIG. 1 through the line III—III. As can be seen in FIG. 3, in contrast to partial spring elements 12, spring limit stops 5 are mechanically relatively stable structures, which are fixedly joined to substrate 4 by connecting layers 21 and 20. Spring limit stops 5 are therefore fixedly joined to substrate 4 and are enabled by their mechanical configuration to be able to absorb greater forces without noticeable deformation. As can be seen likewise in the cross-section of FIG. 3, partial spring elements 12 are configured to be relatively slender in the x direction. Therefore in response to a strong acceleration in the x direction, partial spring elements 12 are markedly deformed, and in response to correspondingly strong acceleration forces, are pressed laterally against one of spring limit stops 5. However, a further deformation of partial spring elements 12 is prevented because their further movement is limited by mechanically rigid spring limit stops 5. The spring limit stops 5 therefore protect the partial spring elements 12 from excessive deformations and from breakage or plate-type deformations. As a result of configuring spring limit stops 5 at the same height as partial spring elements 12, it is assured that spring limit stops 5 will be able to carry out this function even when there are simultaneous acceleration components in the z and x directions.

The components of acceleration sensor 1 such as support 8, spring elements 2, seismic mass 3, mobile electrodes 10, and stationary electrodes 11, are made of a conductive material. In this way, it is made possible to undertake measurement of the sensor signal through the contacting of supports 8, both of supports 8 of stationary electrodes 11, as well as of supports 8 to which spring elements 2 are secured. In that case, in addition to metal, silicon is often chosen as the conductive material since silicon can be processed using very familiar methods from semiconductor manufacturing processes. Usually then for sensors of this type, a substrate 4 made of silicon is also chosen because a substrate of that type is well adjusted, in its thermal coefficient of expansion, to the silicon of the sensor. In the assumption that the sensors are made of silicon and substrate 4 is also made of silicon, FIG. 3 shows a two-layer design for the connective layers between the sensor and substrate 4. Lower layer 20 is composed of an insulating material such as silicon oxide, silicon nitride, a glass, or a mixture of the above-mentioned materials. For second layer 21 provision is made here for a conductive layer, in particular made of a strongly doped polysilicon. As a result of this layer, it is assured that spring limit stops 5 have the same potential as both support 8 and partial spring elements 12. In addition, these layers have proved to be excellent mechanical mounting layers.

FIG. 4 shows a cross-section along the line IV of FIG. 1. FIG. 4 shows a cross-section of a support 8, of four partial spring elements 12, an area of seismic mass 3, and a mass limit stop 6. Insulating layer 20 and conductive layer 21 extend from support 8 underneath partial spring elements 12 and seismic mass 3, to mass limit stop 6. Mass limit stop 6 is thus joined in a mechanically fixed manner to substrate 4. As a result of continuous connecting layer 21, which is configured in the manner of a printed circuit trace, an electrical contact between support 8 and mass limit stop 6 is produced. Thus it is assured that mass limit stop 6 also has the same potential as seismic mass 3 which surrounds it and in this way electrostatic attractive forces between mass limit stop 6 and seismic mass 3 are avoided.

In addition, conductive layer 21 in FIG. 4 forms a limit stop for the seismic mass 3 under partial spring elements 12 in the z direction, the movement of seismic mass 3 and of spring elements 2 being limited by the conductive layer 21 in the direction of substrate 4. In this context, it is essential that conductive layer 21 depicted in FIG. 4 and insulating layer 20 only cover one part of the surface of substrate 4, so that the contact area between seismic mass 3 and conductive layer 21 is slight. Thus it is assured that based on the slight contact surface no significant adhesive forces can arise. Since conductive layer 21 has the same potential as support 8, no electrostatic attractive forces between conductive layer 21 and seismic mass 3 are produced, as a result. Conductive layer 21, therefore, together with insulating layer 20, forms a limit stop which prevents a direct contact of seismic mass 3 and substrate 4. As a result of insulating layer 20, in this context, it is assured that no electrical short-circuit is created between seismic mass 3 and substrate 4.

In FIG. 4, conductive layer 21 and insulating layer 20 are depicted in the form of a printed circuit trace, which connects support 8 and mass limit stop 6 with each other. In a similar fashion, layers 21 and 20 can also be arranged under other areas of seismic mass 3, if the entire surface is significantly smaller than the surface of seismic mass 3, and an electrical contact to support 8 is maintained.

The spring elements 2 depicted in FIG. 1 which are each composed of a plurality of partial spring elements 12, are, in each case, connected with each other via a plurality of connecting bars 13. By using a multiplicity of connecting bars 13, a great resistance to breakage is guaranteed in these connections of the individual partial spring elements.

What is claimed is:

1. A micromechanical component, comprising:
    a substrate;
    a support element;
    at least one spring element having a first end joined to the support element;
    at least one seismic mass joined to a second end of the at least one spring element, the at least one spring element having a rigidity such that a movement of the at least one seismic mass relative to the substrate is capable of being caused by an acceleration parallel to a surface of the substrate; and
    a substrate limit stop disposed on a surface of the substrate and for limiting a movement of the at least one seismic mass perpendicularly to the surface of the substrate in a direction of the substrate, wherein a surface of the substrate limit stop is small in comparison to a surface of the at least one seismic mass, and wherein the substrate limit stop includes an insulating layer and a conductive layer, the insulating layer being deposited directly on the substrate, and the conductive layer being positioned on top of the insulating layer, and wherein the support element is connected to the substrate via the conductive layer and the insulating layer.

2. The micromechanical component according to claim 1, further comprising a mass limit stop for limiting the movement of the at least one seismic mass in response to the acceleration parallel to the surface of the substrate.

3. The micromechanical component according to claim 1, further comprising a spring limit stop disposed on a surface of the substrate for limiting a deformation of the at least one spring element in response to the acceleration parallel to the surface of the substrate.

4. The micromechanical component according to claim 3, further comprising:
   a layer deposited on the substrate, wherein:
      the at least one spring element, the spring limit stop, and the at least one seismic mass are each formed as a pattern from the layer, and
      a height of the at least one spring element is approximately equal to a height of the spring limit stop.

5. The micromechanical component according to claim 4, wherein each one of the substrate and the layer deposited on the substrate includes silicon.

6. The micromechanical component according to claim 1, further comprising:
   a mass limit stop for limiting a deflection of the at least one seismic mass parallel to the surface of the substrate.

7. The micromechanical component according to claim 1, wherein the at least one spring element includes a plurality of partial spring elements arranged essentially in parallel to each other.

8. The micromechanical component according to claim 7, further comprising:
   a plurality of connecting bars for joining the plurality of partial spring elements to each other.

9. The micromechanical component according to claim 1, further comprising:
   a mass limit stop for limiting the movement of the at least one seismic mass in response to the acceleration parallel to the surface of the substrate; and
   a spring limit stop disposed on a surface of the substrate for limiting a deformation of the at least one spring element in response to the acceleration parallel to the surface of the substrate.

10. A micromechanical component, comprising:
   a substrate;
   at least one spring element having a first end joined to the substrate;
   at least one seismic mass joined to a second end of the at least one spring element, the at least one spring element having a rigidity such that a movement of the at least one seismic mass relative to the substrate is capable of being caused by an acceleration parallel to a surface of the substrate;
   a spring limit stop for limiting a deformation of the at least one spring element in response to the acceleration parallel to the surface of the substrate;
   a conductive layer arranged on the substrate for adjusting each one of the at least one spring element, the at least one seismic mass, and the spring limit stop to the same electric potential;
   wherein the conductive layer is arranged underneath the at least one seismic mass, and a surface of the conductive layer arranged beneath the at least one seismic mass is small with respect to a surface of the at least one seismic mass.

11. The micromechanical component according to claim 10, wherein the at least one spring element includes a plurality of partial spring elements arranged essentially in parallel to each other.

12. The micromechanical component according to claim 10, further comprising a mass limit stop for limiting the movement of the at least one seismic mass in response to the acceleration parallel to the surface of the substrate.

13. The micromechanical component according to claim 10, further comprising a substrate limit stop disposed on a surface of the substrate and for limiting a movement of the at least one seismic mass perpendicularly to the surface of the substrate in a direction of the substrate.

14. The micromechanical component according to claim 10, further comprising:
   a mass limit stop for limiting the movement of the at least one seismic mass in response to the acceleration parallel to the surface of the substrate; and
   a substrate limit stop disposed on a surface of the substrate and for limiting a movement of the at least one seismic mass perpendicularly to the surface of the substrate in a direction of the substrate.

15. A micromechanical component, comprising:
   a substrate;
   at least one spring element having a first end joined to the substrate;
   at least one seismic mass joined to a second end of the at least one spring element, the at least one spring element having a rigidity such that a movement of the at least one seismic mass relative to the substrate is capable of being caused by an acceleration parallel to a surface of the substrate;
   a mass limit stop for limiting the movement of the at least one seismic mass in response to the acceleration parallel to the surface of the substrate;
   a conductive layer arranged on the substrate for adjusting each one of the at least one spring element, the at least one seismic mass, and the mass limit stop to the same electric potential;
   wherein the conductive layer is arranged underneath the at least one seismic mass, and a surface of the conductive layer arranged beneath the at least one seismic mass is small with respect to a surface of the at least one seismic mass.

16. The micromechanical component according to claim 15, further comprising a spring limit stop disposed on a surface of the substrate for limiting a deformation of the at least one spring element in response to the acceleration parallel to the surface of the substrate.

17. The micromechanical component according to claim 15, further comprising a substrate limit stop disposed on a surface of the substrate and for limiting a movement of the at least one seismic mass perpendicularly to the surface of the substrate in a direction of the substrate.

18. The micromechanical component according to claim 15, further comprising:
   a spring limit stop disposed on a surface of the substrate for limiting a deformation of the at least one spring element in response to the acceleration parallel to the surface of the substrate; and
   a substrate limit stop disposed on a surface of the substrate and for limiting a movement of the at least one seismic mass perpendicularly to the surface of the substrate in a direction of the substrate.

19. The micromechanical component according to claim 15, wherein the at least one spring element includes a plurality of partial spring elements arranged essentially in parallel to each other.

* * * * *